United States Patent
Kuramoto

(10) Patent No.: US 12,308,614 B2
(45) Date of Patent: *May 20, 2025

(54) VERTICAL CAVITY SURFACE EMITTING DEVICE

(71) Applicant: STANLEY ELECTRIC CO., LTD., Tokyo (JP)

(72) Inventor: Masaru Kuramoto, Tokyo (JP)

(73) Assignee: STANLEY ELECTRIC CO., LTD., Tokyo (JP)

( * ) Notice: Subject to any disclaimer, the term of this patent is extended or adjusted under 35 U.S.C. 154(b) by 862 days.

This patent is subject to a terminal disclaimer.

(21) Appl. No.: 17/285,859

(22) PCT Filed: Oct. 7, 2019

(86) PCT No.: PCT/JP2019/039455
§ 371 (c)(1),
(2) Date: Apr. 15, 2021

(87) PCT Pub. No.: WO2020/080160
PCT Pub. Date: Apr. 23, 2020

(65) Prior Publication Data
US 2021/0351568 A1    Nov. 11, 2021

(30) Foreign Application Priority Data

Oct. 18, 2018   (JP) ................. 2018-196393

(51) Int. Cl.
*H01S 5/183*    (2006.01)
*H01S 5/065*    (2006.01)
(Continued)

(52) U.S. Cl.
CPC ........ *H01S 5/18361* (2013.01); *H01S 5/0655* (2013.01); *H01S 5/1071* (2013.01);
(Continued)

(58) Field of Classification Search
CPC ............... H01S 5/18361; H01S 5/1071; H01S 5/18338; H01S 5/18308–18338;
(Continued)

(56) References Cited

U.S. PATENT DOCUMENTS 1,095,096 A    4/1914  Fleck
5,058,120 A    10/1991 Nitta et al.
(Continued)

FOREIGN PATENT DOCUMENTS

CN    1828959 A     9/2006
CN    101136538 A   3/2008
(Continued)

OTHER PUBLICATIONS

Extended European Search Report (EESR) dated Jun. 22, 2022, issued in counterpart European Application No. 19874482.3.
(Continued)

*Primary Examiner* — Tod T Van Roy
(74) *Attorney, Agent, or Firm* — Holtz, Holtz & Volek PC

(57) ABSTRACT

A vertical cavity surface emitting device includes a substrate, a first multilayer film reflecting mirror formed on the substrate, a light-emitting structure layer formed on the first multilayer film reflecting mirror and including a light-emitting layer, and a second multilayer film reflecting mirror formed on the light-emitting structure layer. A resonator is constituted between the second multilayer film reflecting mirror and the first multilayer film reflecting mirror. The light-emitting structure layer includes a low resistance region and a high resistance region. The low resistance region is disposed in a ring shape between the first multilayer film reflecting mirror and the second multilayer film reflecting mirror. The high resistance region is formed inside
(Continued)

the low resistance region and has an electrical resistance higher than an electrical resistance of the low resistance region.

8 Claims, 8 Drawing Sheets

(51) Int. Cl.
  *H01S 5/10* (2021.01)
  *H01S 5/30* (2006.01)
  *H01S 5/343* (2006.01)
(52) U.S. Cl.
  CPC ...... *H01S 5/18308* (2013.01); *H01S 5/18341* (2013.01); *H01S 5/3095* (2013.01); *H01S 5/34333* (2013.01); *H01S 2301/18* (2013.01)
(58) Field of Classification Search
  CPC ..... H01S 5/18341; H01S 2301/18–185; H01S 5/18322; H01S 5/18325
  See application file for complete search history.

(56) References Cited

U.S. PATENT DOCUMENTS

| | | | |
|---|---|---|---|
| 5,594,751 A | 1/1997 | Scott | |
| 5,625,637 A | 4/1997 | Mori et al. | |
| 5,915,165 A * | 6/1999 | Sun | H01S 5/18311 |
| | | | 438/960 |
| 6,266,356 B1 * | 7/2001 | Kaneko | H01S 5/18308 |
| | | | 372/46.01 |
| 6,376,269 B1 | 4/2002 | Chen et al. | |
| 6,396,865 B1 * | 5/2002 | Mawst | H01S 5/18327 |
| | | | 257/187 |
| 6,403,983 B1 | 6/2002 | Mizuno | |
| 6,507,595 B1 * | 1/2003 | Kapon | H01S 5/423 |
| | | | 372/45.01 |
| 6,515,308 B1 | 2/2003 | Kneissl et al. | |
| 6,546,029 B2 | 4/2003 | Sirbu et al. | |
| 6,621,843 B2 | 9/2003 | Yoo et al. | |
| 6,750,071 B2 * | 6/2004 | Chirovsky | H01S 5/18341 |
| | | | 438/42 |
| 6,751,245 B1 | 6/2004 | Wasserbauer et al. | |
| 6,876,687 B2 | 4/2005 | Zhu et al. | |
| 7,251,262 B2 * | 7/2007 | Kuwata | H01S 5/18394 |
| | | | 372/19 |
| 7,439,550 B2 | 10/2008 | Tomioka et al. | |
| 7,596,163 B2 | 9/2009 | Yoshikawa et al. | |
| 7,986,722 B2 | 7/2011 | Higuchi et al. | |
| 8,030,666 B2 | 10/2011 | Chen et al. | |
| 8,488,644 B2 * | 7/2013 | Imai | H01S 5/18341 |
| | | | 438/542 |
| 8,855,157 B2 | 10/2014 | Higuchi | |
| 9,935,427 B2 | 4/2018 | Tazawa et al. | |
| 9,972,972 B2 | 5/2018 | Tazawa et al. | |
| 10,381,804 B2 | 8/2019 | Tazawa et al. | |
| 10,483,721 B2 | 11/2019 | Tazawa et al. | |
| 10,554,846 B2 | 2/2020 | Kondo | |
| 10,681,474 B2 | 6/2020 | Fishman et al. | |
| 10,892,601 B2 * | 1/2021 | Kuramoto | H01S 5/04253 |
| 11,563,306 B2 * | 1/2023 | Moench | H01S 5/0421 |
| 2001/0028667 A1 | 10/2001 | Kaneko | |
| 2001/0038655 A1 | 11/2001 | Tanaka et al. | |
| 2004/0179566 A1 | 9/2004 | El-Bahar | |
| 2005/0089075 A1 | 4/2005 | Baba et al. | |
| 2005/0147143 A1 * | 7/2005 | Jikutani | H01S 5/18355 |
| | | | 372/43.01 |
| 2007/0025407 A1 | 2/2007 | Koelle | |
| 2007/0071054 A1 | 3/2007 | Takahashi | |
| 2007/0153863 A1 * | 7/2007 | Mochizuki | H01S 5/18327 |
| | | | 372/50.124 |
| 2007/0258499 A1 | 11/2007 | Mochizuki | |
| 2008/0219307 A1 * | 9/2008 | Birkedal | H01S 5/183 |
| | | | 372/44.01 |
| 2008/0279241 A1 | 11/2008 | Oki et al. | |
| 2009/0041075 A1 * | 2/2009 | Hashimoto | H01S 5/18308 |
| | | | 372/45.01 |
| 2009/0180509 A1 * | 7/2009 | Kise | H01S 5/18327 |
| | | | 257/E21.002 |
| 2009/0268774 A1 | 10/2009 | Oki et al. | |
| 2010/0054290 A1 | 3/2010 | Hatakeyama | |
| 2011/0176572 A1 | 7/2011 | Moser et al. | |
| 2012/0008658 A1 | 1/2012 | Chung | |
| 2012/0307855 A1 * | 12/2012 | Chitica | H01S 5/18327 |
| | | | 372/45.01 |
| 2013/0188659 A1 | 7/2013 | Kondo et al. | |
| 2017/0093128 A1 | 3/2017 | Fattal et al. | |
| 2018/0115140 A1 * | 4/2018 | Tazawa | H01S 5/1231 |
| 2018/0366906 A1 | 12/2018 | Hamaguchi et al. | |
| 2019/0086831 A1 | 3/2019 | Kondo | |
| 2019/0245318 A1 * | 8/2019 | LaComb | H01S 5/4043 |
| 2019/0267774 A1 | 8/2019 | Sato et al. | |
| 2019/0363515 A1 * | 11/2019 | Kuramoto | H01S 5/04253 |
| 2020/0185882 A1 | 6/2020 | Zhao et al. | |
| 2021/0104870 A1 | 4/2021 | Sato et al. | |
| 2021/0111538 A1 | 4/2021 | Takeuchi et al. | |
| 2021/0351568 A1 * | 11/2021 | Kuramoto | H01S 5/18341 |
| 2021/0384706 A1 * | 12/2021 | Kuramoto | H01S 5/18361 |
| 2022/0140570 A1 * | 5/2022 | Kuramoto | H01S 5/3063 |
| | | | 372/44.01 |
| 2022/0149595 A1 * | 5/2022 | Kuramoto | H01S 5/18361 |
| 2022/0368107 A1 * | 11/2022 | Tazawa | H01S 5/18369 |
| 2024/0146026 A1 * | 5/2024 | Yokozeki | H01S 5/2054 |

FOREIGN PATENT DOCUMENTS

| | | | | |
|---|---|---|---|---|
| EP | 0944142 | A1 | | 9/1999 |
| EP | 1811620 | A2 | | 7/2007 |
| EP | 3869643 | A1 | | 8/2021 |
| JP | H04363081 | A | | 12/1992 |
| JP | H09018084 | A | | 1/1997 |
| JP | H11121864 | A | | 4/1999 |
| JP | 2000196189 | A | | 7/2000 |
| JP | 2000252584 | A | | 9/2000 |
| JP | 2003163373 | A | | 6/2003 |
| JP | 2004119831 | A | * | 4/2004 |
| JP | 2005197426 | A | | 7/2005 |
| JP | 2005311175 | A | | 11/2005 |
| JP | 2009246194 | A | | 10/2009 |
| JP | 2011205006 | A | * | 10/2011 |
| JP | 2012517705 | A | | 8/2012 |
| JP | 2013175712 | A | | 9/2013 |
| JP | 5707742 | B2 | | 4/2015 |
| JP | 2015525976 | A | | 9/2015 |
| JP | 6369613 | B1 | | 8/2018 |
| JP | 2019208004 | A | | 12/2019 |
| WO | WO-0245223 | A1 | * | 6/2002 ............ B82Y 20/00 |
| WO | 2007116659 | A1 | | 10/2007 |
| WO | 2009119172 | A1 | | 10/2009 |
| WO | 2014018942 | A1 | | 1/2014 |
| WO | 2017018017 | A1 | | 2/2017 |
| WO | 2018083877 | A1 | | 5/2018 |
| WO | 2018180450 | A1 | | 10/2018 |
| WO | 2018184288 | A1 | | 10/2018 |
| WO | 2020080160 | A1 | | 4/2020 |
| WO | 2020080161 | A1 | | 4/2020 |
| WO | 2020170818 | A1 | | 8/2020 |

OTHER PUBLICATIONS

U.S. Appl. No. 17/285,635, First Named Inventor: Masaru Kuramoto; Title: "Vertical Cavity Surface Emitting Device"; filed Apr. 15, 2021.

International Search Report (ISR) (and English translation thereof) dated Dec. 24, 2019 issued in International Application No. PCT/JP2019/039455.

Written Opinion dated Dec. 24, 2019 issued in International Application No. PCT/JP2019/039455.

Chinese Office Action (and an English language translation thereof) dated Jan. 23, 2024, issued in Chinese Application No. 202080015430.4 (which is a counterpart of related U.S. Appl. No. 17/432,470).

(56) References Cited

OTHER PUBLICATIONS

Chinese Office Action (and an English language translation thereof) dated Nov. 17, 2023, issued in Chinese Application No. 201980068567.3 (which is a counterpart of related U.S. Appl. No. 17/285,635).

Chinese Office Action (and an English language translation thereof) dated Nov. 20, 2023, issued in counterpart Chinese Application No. 201980068659.1.

Extended European Search Report (EESR) dated Jun. 22, 2022, issued in counterpart European Application No. 19872622.6.

International Search Report (ISR) (and English translation thereof) dated May 12, 2020 issued in International Application No. PCT/JP2020/004314.

Extended European Search Report (EESR) dated Oct. 28, 2022, issued in counterpart European Application No. 20760005.7.

International Search Report (ISR) (and English translation thereof) dated Dec. 24, 2019 issued in International Application No. PCT/JP2019/039456.

Japanese Office Action (and an English language translation thereof) dated Feb. 14, 2023, issued in Japanese Application No. 2019-029294.

Related U.S. Appl. No. 17/285,635, First Named Inventor: Masaru Kuramoto; Title: "Vertical Cavity Surface Emitting Device"; filed Apr. 15, 2021.

Related U.S. Appl. No. 17/432,470, First Named Inventor: Masaru Kuramoto; Title: "Vertical Cavity Surface Emitting Device"; filed Aug. 19, 2021.

U.S. Appl. No. 17/432,466; First Named Inventor: Masaru Kuramoto; Title: "Vertical Cavity Surface Emitting Device"; filed Aug. 19, 2021.

Written Opinion dated Dec. 24, 2019 issued in International Application No. PCT/JP2019/039456.

Written Opinion dated May 12, 2020 issued in International Application No. PCT/JP2020/004314.

Chinese Search Report (and an English translation thereof) dated Apr. 11, 2024, issued in counterpart Chinese Application No. 201980068659.1.

Office Action (Final Rejection) dated Mar. 28, 2024, issued in related U.S. Appl. No. 17/285,635.

Office Action (Non-Final Rejection) dated Nov. 24, 2023, issued in related U.S. Appl. No. 17/285,635.

Chinese Search Report (and an English translation thereof) dated May 31, 2024, issued in Chinese Application No. 2020800154304 (which is a counterpart of related U.S. Appl. No. 17/432,470).

Office Action (Non-Final Rejection) dated Jun. 6, 2024, issued in related U.S. Appl. No. 17/432,470.

Office Action (Final Rejection) dated Oct. 31, 2024, issued in related U.S. Appl. No. 17/285,859.

Office Action (Non-Final Rejection) dated Mar. 10, 2025, issued in related U.S. Appl. No. 17/432,470.

* cited by examiner

W1 ≦ 2.3μm

W1 ≧ 2.85μm

VERTICAL CAVITY SURFACE EMITTING DEVICE

TECHNICAL FIELD

The present invention relates to a vertical cavity surface emitting device, such as a vertical cavity surface emitting laser.

BACKGROUND ART

The vertical cavity surface emitting laser (hereinafter simply referred to as a surface emitting laser) is a semiconductor laser that includes reflecting mirrors formed of multilayer films stacked on a substrate and emits light in a direction perpendicular to a surface of the substrate. For example, Patent Document 1 discloses a surface emitting laser using a nitride semiconductor.

PRIOR ART DOCUMENTS

Patent Literature

Patent Document 1: Japanese Patent No. 5707742

SUMMARY OF THE INVENTION

Problems to be Solved by the Invention

For example, in the vertical cavity surface emitting device, such as the surface emitting laser, it is preferred that a light emission pattern is stable, for example, a far-field pattern is stable. Accordingly, for example, a resonator configured to generate light in a desired transverse mode is preferably configured in the vertical cavity surface emitting device. For example, generating a laser beam in a fundamental eigenmode allows obtaining a far-field pattern of unimodal laser beam having a low emission angle and a high-output power.

The present invention has been made in consideration of the above-described points and an object of which is to provide a vertical cavity surface emitting device that allows emitting light in a stable transverse mode.

Solutions To The Problems

A vertical cavity surface emitting device according to the present invention includes a substrate, a first multilayer film reflecting mirror, a light-emitting structure layer, and a second multilayer film reflecting mirror. The first multilayer film reflecting mirror is formed on the substrate. The light-emitting structure layer is formed on the first multilayer film reflecting mirror and includes a light-emitting layer. The second multilayer film reflecting mirror is formed on the light-emitting structure layer. A resonator is constituted between the second multilayer film reflecting mirror and the first multilayer film reflecting mirror. The light-emitting structure layer includes a low resistance region and a high resistance region. The low resistance region is disposed in a ring shape between the first multilayer film reflecting mirror and the second multilayer film reflecting mirror. The high resistance region is formed inside the low resistance region and has an electrical resistance higher than an electrical resistance of the low resistance region.

DESCRIPTION OF PREFERRED EMBODIMENTS

The following will describe embodiments of the present invention in detail. In the following embodiments, a case where the present invention is embodied as a surface emitting laser (semiconductor laser) will be described. However, the present invention is not limited to the surface emitting laser but applicable to various kinds of vertical cavity surface emitting devices, such as a vertical cavity surface emitting diode.

Embodiment 1

Figure 1:
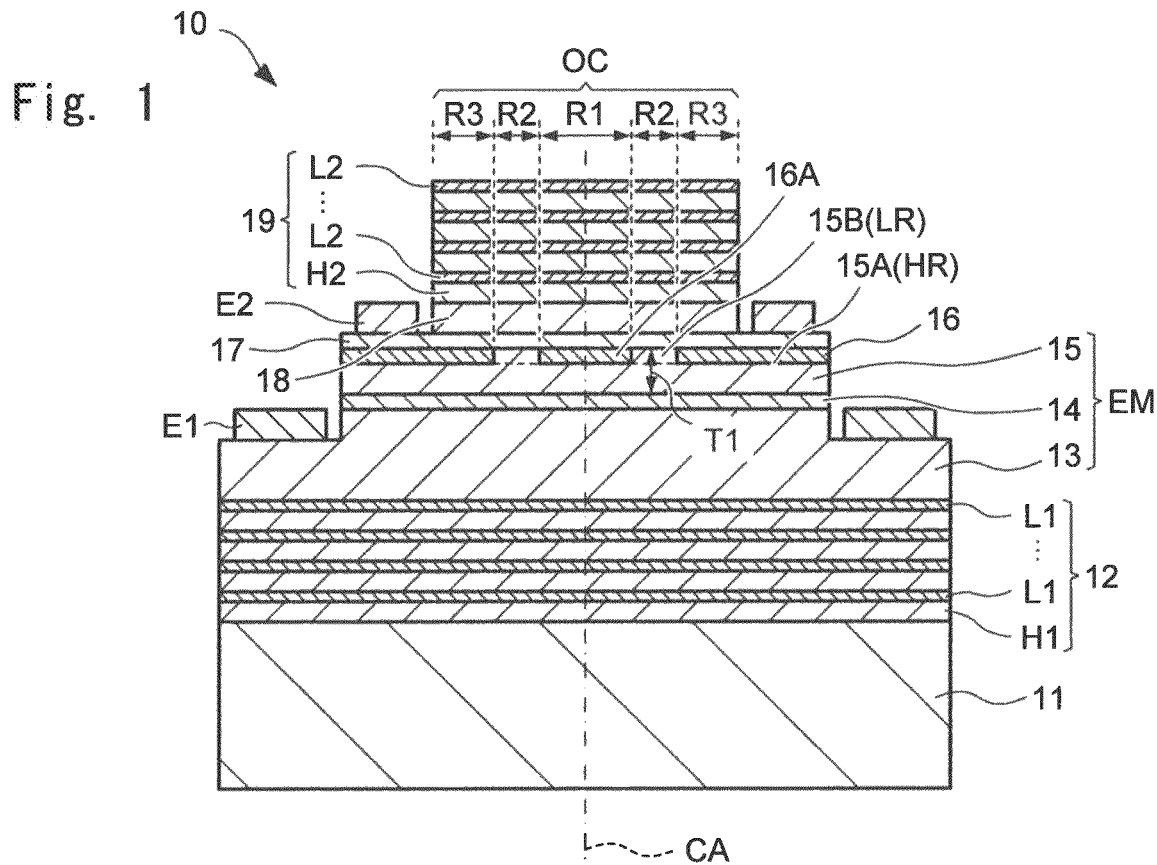
FIG. 1 is a cross-sectional view of a surface emitting laser according to Embodiment 1.
Figure 2:
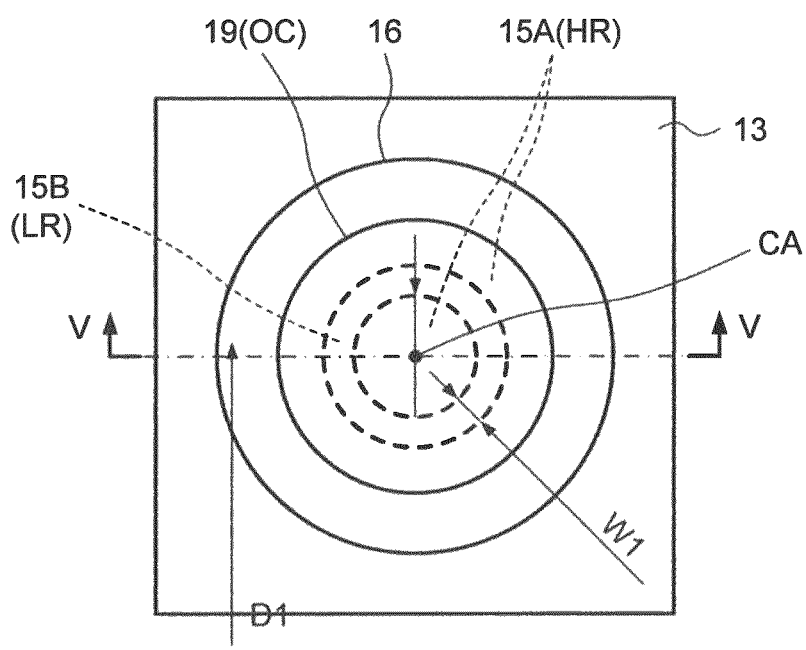
FIG. 2 is a schematic top view of the surface emitting laser according to Embodiment 1.

FIG. 1 is a cross-sectional view of a Vertical Cavity Surface Emitting Laser (hereinafter referred to as a surface emitting laser: VCSEL) according to Embodiment 1. FIG. 2 is a schematic top view of a surface emitting laser 10. FIG. 1 is a cross-sectional view taken along the line V-V in FIG. 2. The configuration of the surface emitting laser 10 will be described with reference to FIG. 1 and FIG. 2.

The surface emitting laser 10 includes a substrate 11 and a first multilayer film reflecting mirror (hereinafter simply referred to as a first reflecting mirror) 12 formed on the substrate 11. In this embodiment, the first reflecting mirror 12 is formed on the substrate 11 and has a structure in which first semiconductor films (hereinafter referred to as high refractive index semiconductor films) H1 and second semiconductor films (hereinafter referred to as low refractive index semiconductor films) L1 having a refractive index lower than that of the high refractive index semiconductor film H1 are stacked in alternation.

That is, in this embodiment, the first reflecting mirror 12 is a semiconductor multilayer film reflecting mirror constituting a Distributed Bragg Reflector (DBR) made of a semiconductor material.

In this embodiment, the substrate 11 has a composition of GaN. The substrate 11 is a substrate for growth used for crystal growth of the first reflecting mirror 12. The high refractive index semiconductor film H1 in the first reflecting mirror 12 has a composition of GaN, and the low refractive index semiconductor film L1 has a composition of AlInN. In this embodiment, between the substrate 11 and the first reflecting mirror 12, a buffer layer (not illustrated) having a composition of GaN is disposed.

The surface emitting laser 10 includes a light-emitting structure layer EM formed on the first reflecting mirror 12 and including a light-emitting layer 14. In this embodiment, the light-emitting structure layer EM includes a plurality of semiconductor layers made of a nitride-based semiconductor. The light-emitting structure layer EM includes an n-type semiconductor layer (first semiconductor layer) 13 formed on the first reflecting mirror 12, the light-emitting layer (active layer) 14 formed on the n-type semiconductor layer 13, and a p-type semiconductor layer (second semiconductor layer) 15 formed on the light-emitting layer 14.

In this embodiment, the n-type semiconductor layer 13 has a composition of GaN and contains Si as n-type impurities. The light-emitting layer 14 has a quantum well structure that includes a well layer having a composition of InGaN and a barrier layer having a composition of GaN. The p-type semiconductor layer 15 has a GaN-based composition and contains Mg as p-type impurities.

The configuration of the light-emitting structure layer EM is not limited to this. For example, the n-type semiconductor layer 13 may include a plurality of n-type semiconductor layers having mutually different compositions. The p-type semiconductor layer 15 may include a plurality of p-type semiconductor layers having mutually different compositions.

For example, the p-type semiconductor layer 15 may include, for example, an AlGaN layer as an electron-blocking layer (not illustrated) that reduces an overflow of electrons injected into the light-emitting layer 14 to the p-type semiconductor layer 15 at the interface with the light-emitting layer 14. The p-type semiconductor layer 15 may include a contact layer (not illustrated) to form an ohmic contact with an electrode. In this case, for example, the p-type semiconductor layer 15 only needs to include a GaN layer as a cladding layer between the electron-blocking layer and the contact layer.

In this embodiment, the p-type semiconductor layer 15 includes an upper surface 15A and a projection 15B projected from the upper surface 15A. When viewed in a direction perpendicular to the upper surface 15A, the projection 15B has a ring shape. In this embodiment, as illustrated in FIG. 2, the projection 15B is a surface region of the p-type semiconductor layer 15 projecting from the upper surface 15A in a circular ring shape.

The surface emitting laser 10 includes an insulating layer (first insulating layer) 16 formed on the upper surface 15A excluding the projection 15B of the p-type semiconductor layer 15. In this embodiment, the insulating layer 16 is in contact with the upper surface 15A of the p-type semiconductor layer 15 and the side surface of the projection 15B of the p-type semiconductor layer 15. The insulating layer 16 has translucency to light emitted from the light-emitting layer 14 and is made of a material having a refractive index lower than that of the p-type semiconductor layer 15 (the projection 15B), for example, an oxide, such as $SiO_2$.

Additionally, the insulating layer 16 includes an inner insulating portion 16A formed on a region surrounded by the projection 15B in the upper surface 15A of the p-type semiconductor layer 15. In this embodiment, the surface on the side opposite to the light-emitting layer 14 of the p-type semiconductor layer 15 is exposed from the insulating layer 16 in the upper end surface of the projection 15B.

The surface emitting laser 10 includes a light-transmitting electrode layer 17 formed on the insulating layer 16 and connected to the p-type semiconductor layer 15 in the projection 15B of the p-type semiconductor layer 15. The light-transmitting electrode layer 17 is a conductive film having translucency to light emitted from the light-emitting layer 14. The light-transmitting electrode layer 17 is in contact with the upper surface of the insulating layer 16 and the upper end surface of the projection 15B of the p-type semiconductor layer 15. For example, the light-transmitting electrode layer 17 is made of a metal oxide film, such as ITO or IZO.

The insulating layer 16 functions as a current confinement layer that confines a current injected into the light-emitting structure layer EM via the light-transmitting electrode layer 17. First, the projection 15B of the p-type semiconductor layer 15 is exposed from the insulating layer 16 and in contact with the light-transmitting electrode layer 17 (electrode) to function as a low resistance region LR in the light-emitting structure layer EM. The region where the projection 15B of the p-type semiconductor layer 15 is disposed functions as a current injected region from which a current is injected into the light-emitting layer 14.

The regions inside and outside the projection 15B (the regions of the upper surface 15A) in the p-type semiconductor layer 15 function as high resistance regions HR having an electrical resistance higher than that of the low resistance region LR by being covered with the insulating layer 16. That is, the region where the upper surface 15A is disposed of the p-type semiconductor layer 15 functions as a non-current injected region where the injection of the current into the light-emitting layer 14 is suppressed.

In other words, the light-emitting structure layer EM includes : the low resistance region LR disposed in the ring shape between the first and the second reflecting mirrors 12 and 19, and the high resistance regions HR that is formed inside and outside the low resistance region LR and has the electrical resistances higher than that of the low resistance region LR.

The surface emitting laser 10 includes an insulating layer (second insulating layer) 18 formed on the light-transmitting electrode layer 17. For example, the insulating layer 18 is made of a metal oxide, such as $Ta_2O_5$, $Nb_2O_5$, $ZrO_2$, $TiO_2$, and $HfO_2$. The insulating layer 18 has translucency to the light emitted from the light-emitting layer 14.

The surface emitting laser 10 includes the second multilayer film reflecting mirror (hereinafter simply referred to as the second reflecting mirror) 19 formed on the insulating layer 18. The second reflecting mirror 19 is disposed at a position facing the first reflecting mirror 12 via the light-emitting structure layer EM. A resonator OC having a direction perpendicular to the light-emitting structure layer EM (a direction perpendicular to the substrate 11) as a resonator length direction is constituted between the second reflecting mirror 19 and the first reflecting mirror 12.

In this embodiment, as illustrated in FIG. 2, the second reflecting mirror 19 has a column shape. Therefore, in this embodiment, the surface emitting laser 10 includes the column-shaped resonator OC.

In this embodiment, the second reflecting mirror 19 has a structure in which first dielectric films (hereinafter referred to as high refractive index dielectric films) H2 and second dielectric films (hereinafter referred to as low refractive index dielectric films) L2 having a refractive index lower than that of the high refractive index dielectric films H2 are stacked in alternation.

That is, in this embodiment, the second reflecting mirror 19 is a dielectric multilayer film reflecting mirror constituting a Distributed Bragg Reflector (DBR) made of a dielectric material. In this embodiment, the high refractive index dielectric film H2 is formed of a Ta2O5 layer, and the low refractive index dielectric film L2 is made of an Al2O3 layer.

The projection 15B of the p-type semiconductor layer 15 in the light-emitting structure layer EM, namely, the low resistance region LR is disposed in the region between the first reflecting mirror 12 and the second reflecting mirror 19. That is, in this embodiment, the resonator OC includes a ring-shaped region R2 extending between the first and the second reflecting mirrors 12 and 19 corresponding to the low resistance region LR in the light-emitting structure layer EM, a central region R1 disposed corresponding to the high resistance region HR at the inside of the ring-shaped region R2, and an outer region R3 disposed outside the ring-shaped region R2.

In this embodiment, the insulating layer 16 has a refractive index lower than that of the p-type semiconductor layer 15. Therefore, the central region R1 and the outer region R3 in the resonator OC have an equivalent refractive index lower than that of the ring-shaped region R2. That is, the central region R1 and the outer region R3 function as low refractive index regions, and the ring-shaped region R2 functions as a high refractive index region. In this embodiment, the central region R1 has a column shape, and the ring-shaped region R2 and the outer region R3 each have a cylindrical shape.

The surface emitting laser 10 includes first and second electrodes E1 and E2 that apply electric current to the light-emitting structure layer EM. The first electrode E1 is formed on the n-type semiconductor layer 13. The second electrode E2 is formed on the light-transmitting electrode layer 17.

The application of a voltage between the first and the second electrodes E1 and E2 emits the light from the light-emitting layer 14 in the light-emitting structure layer EM. The light emitted from the light-emitting layer 14 repeats reflection between the first and the second reflecting mirrors 12 and 19, thus entering a resonance state (performing laser oscillation).

In this embodiment, the first reflecting mirror 12 has reflectance slightly lower than that of the second reflecting mirror 19. Therefore, a part of the light resonated between the first and the second reflecting mirrors 12 and 19 transmits through the first reflecting mirror 12 and the substrate 11 and is taken to the outside. Thus, the surface emitting laser 10 emits the light in the direction perpendicular to the substrate 11 and the light-emitting structure layer EM.

The projection 15B of the p-type semiconductor layer 15 in the light-emitting structure layer EM defines a luminescence center in the light-emitting layer 14 and defines a center axis CA of the resonator OC. The center axis CA of the resonator OC passes through the center of the projection 15B of the p-type semiconductor layer 15 and extends in the direction perpendicular to the p-type semiconductor layer 15 (light-emitting structure layer EM). In this embodiment, the center of the projection 15B of the p-type semiconductor layer 15 is disposed at a position corresponding to the center of the inner insulating portion 16A in the insulating layer 16.

Here, an exemplary configuration of each layer in the surface emitting laser 10 will be described. In this embodiment, the first reflecting mirror 12 is formed of 44 pairs of GaN layers and AlInN layers. The n-type semiconductor layer 13 has a layer thickness of 650 nm. The light-emitting layer 14 is formed of an active layer having a multiple quantum well structure in which 4 nm of InGaN layers and 5 nm of GaN layers are stacked three times. The second reflecting mirror 19 is formed of 10 pairs of Ta2O5 layers and Al2O3 layers.

The p-type semiconductor layer 15 has a layer thickness T1 of 50 nm in the region of the projection 15B. The p-type semiconductor layer 15 has a layer thickness of 30 nm in the region of the upper surface 15A. The projection 15B has an inner diameter D1 of 3.3 μm. The projection 15B has an outer diameter of 10 μm. The projection 15B has a width W1 of 3.35 μm.

The insulating layer 16 has a layer thickness of 20 nm. The upper surface of the insulating layer 16 is formed to be flush with the upper end surface of the projection 15B of the p-type semiconductor layer 15. Note that these are merely one example.

Figure 3:
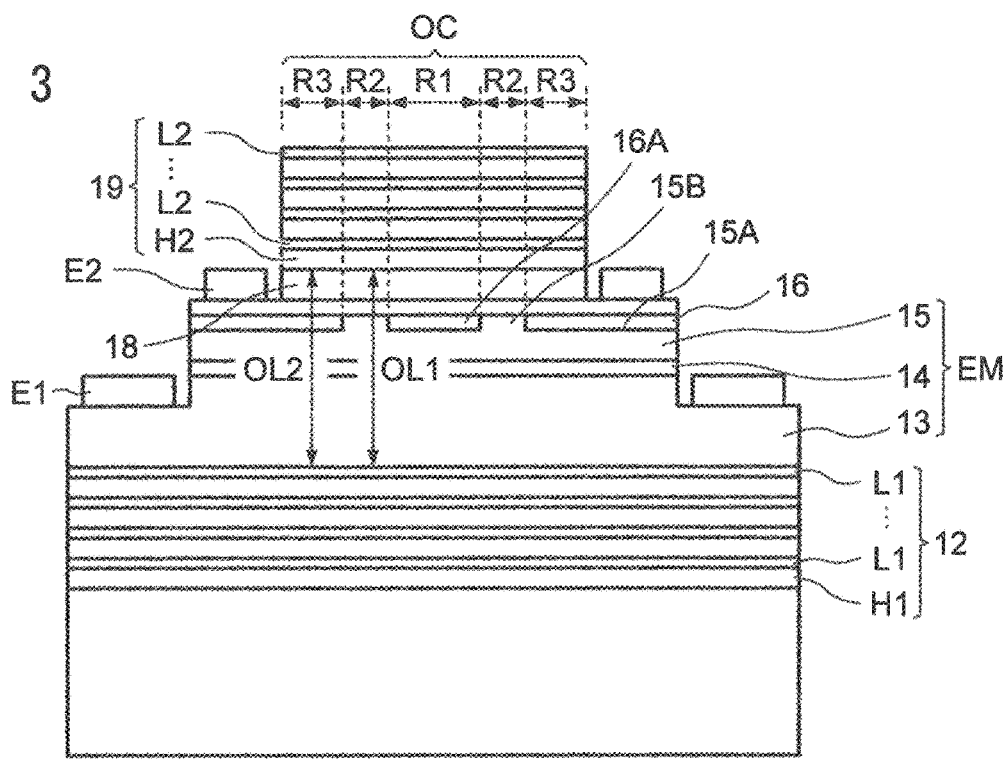
FIG. 3 is a drawing schematically illustrating a configuration of a resonator in the surface emitting laser according to Embodiment 1.

FIG. 3 is a drawing schematically illustrating an optical property of the resonator OC in the surface emitting laser 10. Although FIG. 3 is a cross-sectional view similar to FIG. 1, FIG. 3 omits hatchings. In this embodiment, the insulating layer 16 has a refractive index lower than that of the p-type semiconductor layer 15 and is formed at a height same as the upper end surface of the projection 15B of the p-type semiconductor layer 15. The layer thicknesses of the other layers between the first and the second reflecting mirrors 12 and 19 are each constant.

Therefore, the equivalent refractive index (an optical distance between the first and the second reflecting mirrors 12 and 19, a resonator length) in the resonator OC differs among the central region R1, the ring-shaped region R2, and the outer region R3 by a difference in refractive index between the p-type semiconductor layer 15 and the insulating layer 16.

Specifically, as illustrated in FIG. 3, when an optical distance between the first and the second reflecting mirrors 12 and 19 in the ring-shaped region R2 is defined as an optical distance OL1 and an optical distance between the first and the second reflecting mirrors 12 and 19 in the central region R1 and the outer region R3 is defined as an optical distance OL2, the optical distance OL2 is smaller than the optical distance OL1. That is, the equivalent resonator length in the central region R1 and the outer region R3 is smaller than the equivalent resonator length in the ring-shaped region R2.

Figure 4:
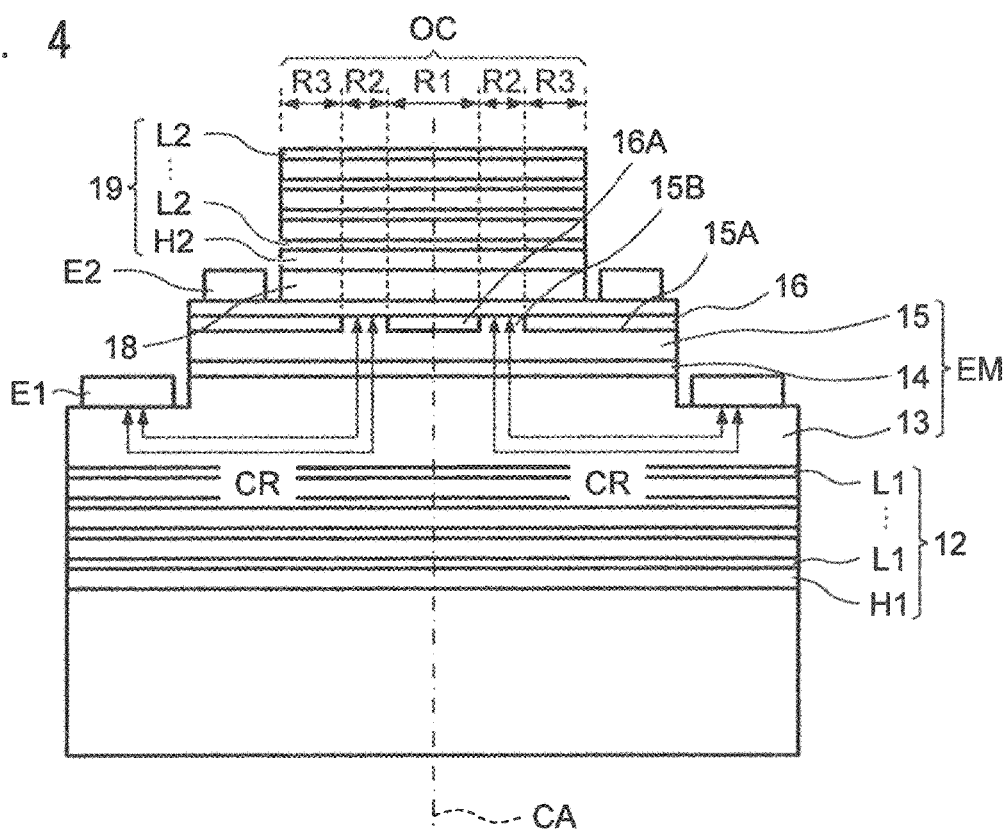
FIG. 4 is a drawing schematically illustrating current paths in the surface emitting laser according to Embodiment 1.

FIG. 4 is a drawing schematically illustrating an electrical property in the resonator OC (in the light-emitting structure layer EM) of the surface emitting laser 10. FIG. 4 is a drawing schematically illustrating currents CR flowing through the inside of the light-emitting structure layer EM. Although FIG. 4 is a cross-sectional view similar to FIG. 1, FIG. 4 omits hatchings. In this embodiment, the ring-shaped region R2, which is the region of the projection 15B, functions as the low resistance region LR, and the central region R1 and the outer region R3, which are the other regions, function as the high resistance regions HR.

Therefore, as illustrated in FIG. 4, the current CR is injected into the light-emitting layer 14 only in the ring-shaped region R2, and the current is hardly injected into the light-emitting layer 14 in the central region R1. That is, while light is generated (a gain is generated) in the ring-shaped region R2, light is not generated in the central region R1.

Figure 5:
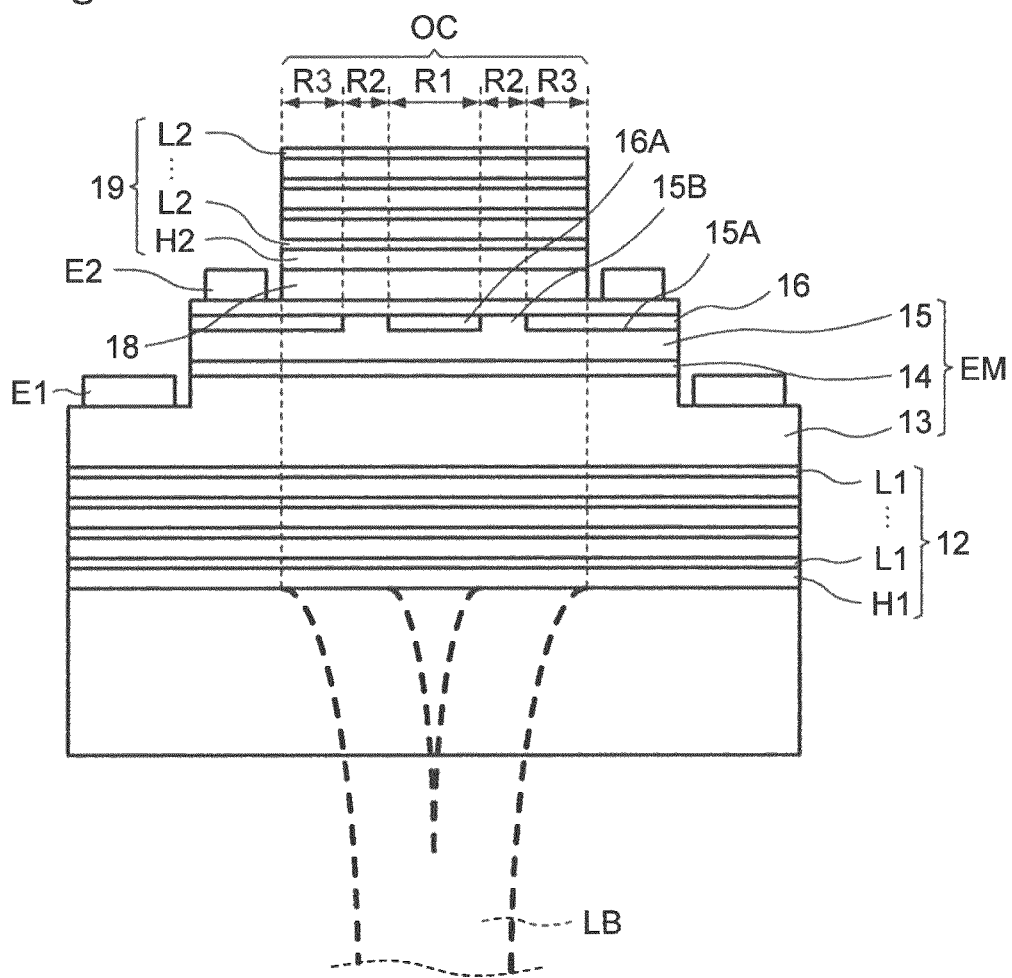
FIG. 5 is a drawing schematically illustrating light emitted from the surface emitting laser according to Embodiment 1.

FIG. 5 is a drawing schematically illustrating light emitted from the surface emitting laser 10. In this embodiment, a standing wave in the surface emitting laser 10 is taken to the outside from the first reflecting mirror 12. Here, as illustrated in FIG. 5, light resonated in the surface emitting laser 10 is taken to the outside while being converged at the central region R1. FIG. 5 schematically illustrates a beam outer edge of a laser beam LB emitted from the surface emitting laser 10 by the dashed line.

Specifically, first, in this embodiment, the refractive index of the insulating layer 16 is smaller than the refractive index of the p-type semiconductor layer 15 (projection 15B). Accordingly, the difference in equivalent refractive index is provided between the regions R1 to R3 in the resonator OC. In this embodiment, the equivalent refractive index of the resonator OC (laser medium) in the outer region R3 is smaller than the equivalent refractive index of the resonator OC in the ring-shaped region R2.

This suppresses an optical loss due to divergence (emission) of the standing wave in the resonator OC from the ring-shaped region R2 to the outside. That is, a large amount of light remains in the inside of the ring-shaped region R2, and the laser beam LB is taken to the outside in the state. Accordingly, a large amount of light concentrates on the ring-shaped region R2 in the resonator OC, thereby ensuring generating and emitting the laser beam LB with high output power.

In this embodiment, by providing the difference in equivalent refractive index, an optical confinement structure in the resonator OC is formed. Therefore, almost all light serves as the laser beams LB without causing deterioration of intensity. This allows highly efficiently generating and emitting the laser beam LB with high output power.

Next, in this embodiment, the low resistance region LR, that is, the current injected region to the light-emitting layer 14 is restricted to only the ring-shaped region R2. That is, the current is not injected into the central region R1, but the current injected region is disposed surrounding the non-current injected region. This allows stabilizing an eigenmode of the laser beam LB.

Specifically, considering a wavelength of the light emitted from the light-emitting layer 14, mainly adjusting the width W1 (see FIG. 2) of the low resistance region LR, namely, a current injection width, allows emitting the laser beam LB in the stable eigenmode. Thus, the stable, highly intensive far-field pattern can be obtained.

Figure 6A:
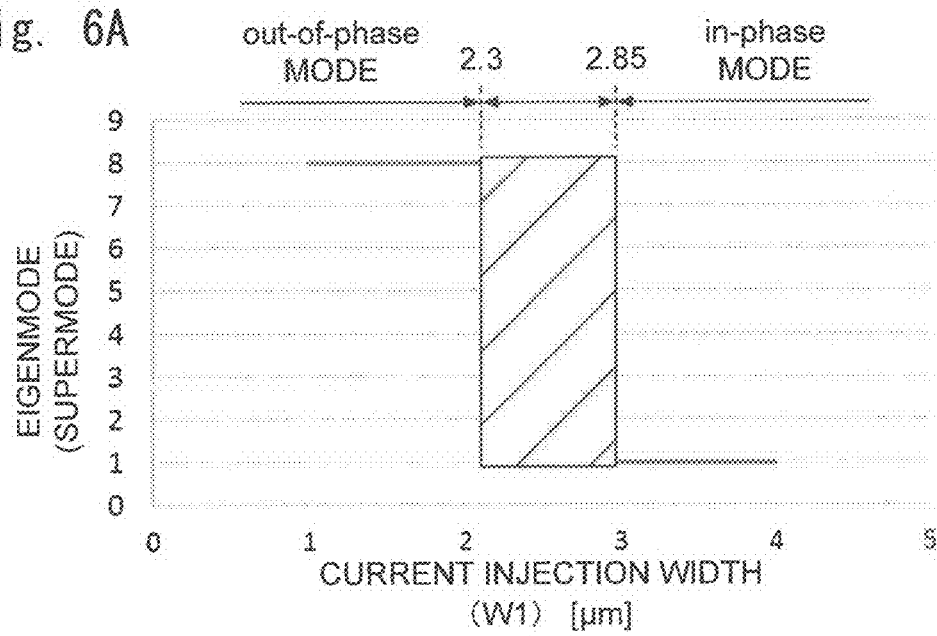
FIG. 6A is a drawing illustrating a relationship between a width of a current injected region and an eigenmode in the surface emitting laser according to Embodiment 1.

FIG. 6A is a drawing illustrating a relationship between the current injection width W1 and the eigenmode (also referred to as a super mode) of the laser beam LB. FIG. 6A plots the width W1 of the low resistance region LR (namely, the projection 15B) on the horizontal axis and the number of eigenmodes of the laser beam LB on the vertical axis. Note that FIG. 6A illustrates a change in eigenmode of the laser beam LB relative to the width W1.

Figure 6B:
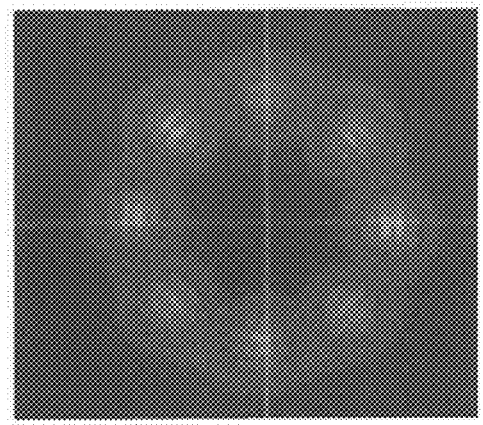
FIG. 6B is a drawing illustrating an example of a far-field pattern of the light emitted from the surface emitting laser according to Embodiment 1.

As illustrated in FIG. 6A, with the current injection width W1 of 2.3 µm or less, the eighth eigenmode appears. In other words, there are eight beam spots in the ring-shaped region R2, and a mode in which a phase is inverted between the adjacent spots appears (an out-of-phase mode is attained). Therefore, in the far-field pattern, the multimodal laser beam LB is observed. FIG. 6B is a drawing illustrating the far-field pattern of the laser beam LB with the current injection width W1 of less than 2.3 µm.

Figure 6C:
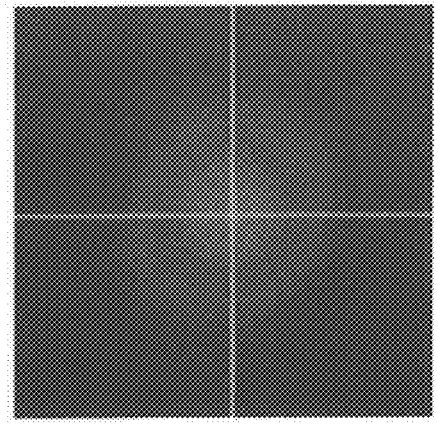
FIG. 6C is a drawing illustrating another example of the far-field pattern of the light emitted from the surface emitting laser according to Embodiment 1.

Meanwhile, with the current injection width W1 of 2.85 µm or more, the mode enters the fundamental eigenmode. Specifically, the eight beam spots are present in the ring-shaped region R2, and a mode in which all the spots become in the same phase appears (an in-phase mode is attained) . Therefore, the unimodal laser beam LB is emitted. FIG. 6C is a drawing illustrating the far-field pattern of the laser beam LB with the current injection width W1 larger than 2.85 µm.

The inventor of this application has confirmed that the eigenmode changes between the in-phase mode and the out-of-phase mode depending on the applied current value in a range of the current injection width W1 of from 2.3 to 2.85 µm.

Thus, disposing the low resistance region LR in the ring shape and adjusting the width W1 ensure generating the laser beam LB in the stable eigenmode, thus forming the stable far-field pattern. However, considering generating the laser beam LB in the stable transverse mode, it is only necessary to dispose the ring-shaped low resistance region LR and the high resistance region HR inside the low resistance region LR in the resonator OC.

The current injection width W1 can be adjusted according to mainly the wavelength of the laser beam LB (that is, the light emitted from the light-emitting layer 14) and the equivalent refractive index of the resonator OC. For example, to adjust the width W1 considering only the emission wavelength, when the wavelength of the light emitted from the light-emitting layer 14 is defined as a wavelength λ, the current injection width W1 only needs to be set so as to meet the relationship $W1 \geq 2.85 \times (\lambda/0.445)$ [µm] considering obtaining the unimodal laser beam LB.

Additionally, adjusting the width W1 considering both of the emission wavelength and the equivalent refractive index allows further stabilizing the eigenmode of the laser beam LB. For example, in a case where the wavelength of the light emitted from the light-emitting layer 14 is defined as the wavelength λ, the equivalent refractive index of the ring-shaped region R2 relative to the wavelength λ is defined as a refractive index nλ, and the equivalent refractive index of the ring-shaped region R2 relative to a wavelength at 445 nm is defined as a refractive index $n_{445}$, considering obtaining the unimodal laser beam LB, the width W1 of a current injected region CJ only needs to be set so as to meet the relationship $W1 \geq 2.85 \times (\lambda/0.445) \times (n\lambda/n_{445})$ [µm].

The inventor of this application has confirmed that the current injection width W1 of 5.5 µm or less is preferred to obtain the laser beam LB in the stable single eigenmode. This is because, with the width W1 of larger than 5.5 µm, when a threshold of laser oscillation was exceeded, the laser beam LB was emitted in multimode in some cases. That is, considering obtaining the unimodal laser beam LB at the wavelength λ of 445 nm, the width W1 only needs to meet the relationship $2.85 \leq W1 \leq 5.5$ [µm]. This range only needs to be adjusted according to the emission wavelength λ and the equivalent refractive index of the ring-shaped region R2.

The inner diameter D1 (see FIG. 2) of the low resistance region LR can be set to the preferred range considering a diffusion length of carriers (electrons or electron holes) in the light-emitting layer 14. For example, the diffusion length of carriers in the light-emitting layer 14 corresponds to a distance that the carriers move in a direction (lateral direction) parallel to the light-emitting layer 14 in the light-emitting layer 14.

For example, in this embodiment, the region of the light-emitting layer 14 into which a current is not injected is preferably formed inside the ring-shaped region R2. Accordingly, when viewed in the direction perpendicular to the light-emitting layer 14, when the low resistance region LR has the inner diameter D1 twice or more of the diffusion length of the carriers (the electrons in this embodiment) in the light-emitting layer 14, the region into which a current is not injected is formed in at least a part of the region of the light-emitting layer 14 inside the ring-shaped region R2. Therefore, when viewed in the direction perpendicular to the light-emitting layer 14, the low resistance region LR preferably has the inner diameter D1 twice or more of the diffusion length of carriers in the light-emitting layer 14. That is, the width of the high resistance region HR inside the low resistance region LR is preferably twice or more of the diffusion length of the carriers in the light-emitting layer 14.

Similarly, a layer thickness T1 (in this embodiment, a distance from the upper end surface of the projection 15B to the interface with the light-emitting layer 14, see FIG. 1) of the p-type semiconductor layer 15 can also be set to a preferred range considering the diffusion length of carriers in the light-emitting layer 14. The layer thickness T1 of the p-type semiconductor layer 15 is preferably twice or less of the diffusion length of carriers in the light-emitting layer 14. This allows forming the region of the light-emitting layer 14 where the carriers (electrons) do not reach, at the inside of the ring-shaped region R2.

In this embodiment, the ring-shaped region R2 is the low resistance region LR and the high refractive index region. Therefore, not only the most injected current can be used to generate the laser beam LB, but also the loss of the laser beam LB in the central region R1 or the outer region R3 due to the difference in refractive index can be substantially suppressed. Therefore, the laser beam LB in the stable transverse mode with high output power can be generated at a low threshold and high efficiency. Additionally, since a current does not flow through the central region R1, heat generation in the central region R1 can be suppressed, and an operation at a high temperature is possible.

In this embodiment, the case where the ring-shaped region R2 is the high refractive index region and the central region R1 and the outer region R3 are the low refractive index regions has been described. That is, the case where the boundary between the low resistance region LR and the high resistance region HR is disposed at the position matched with the boundary between the high refractive index region and the low refractive index region has been described. However, configurations of the central region R1, the ring-shaped region R2, and the outer region R3 are not limited to these.

Considering obtaining the laser beam LB in the stable transverse mode, it is only necessary to dispose the ring-shaped low resistance region LR and the high resistance region HR inside the low resistance region LR between the first and the second reflecting mirrors 12 and 19. For example, the boundary between the high refractive index region and the low refractive index region may be disposed at a position different from the boundary between the central region R1 and the ring-shaped region R2.

In this embodiment, the case where the p-type semiconductor layer 15 includes the projection 15B and the projection 15B contacts the light-transmitting electrode layer 17 to function as the low resistance region LR has been described. However, it is only necessary that the light-emitting structure layer EM includes the ring-shaped low resistance region LR. For example, the n-type semiconductor layer 13 may include a projection similar to the projection 15B. That is, the low resistance region LR and the high resistance region HR may be disposed in the n-type semiconductor layer 13.

Additionally, in this embodiment, the case where the low resistance region LR, namely, the projection 15B of the p-type semiconductor layer 15 is formed in the circular ring shape has been described. However, the configuration of the low resistance region LR is not limited to this.

Figure 7A:
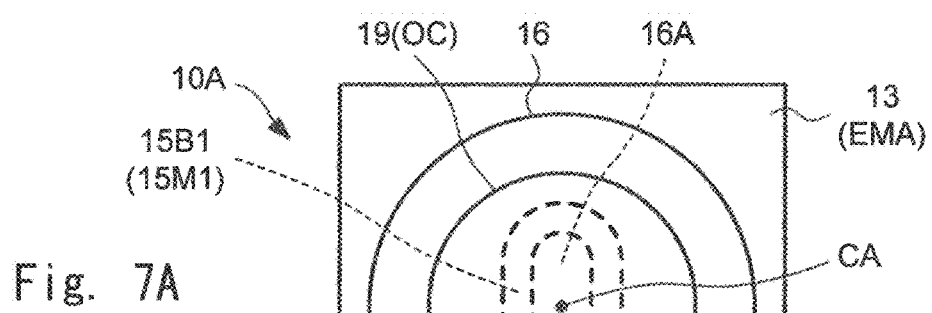
FIG. 7A is a schematic top view of a surface emitting laser according to Modification 1 of Embodiment 1.

FIG. 7A is a schematic top view of a surface emitting laser 10A according to Modification 1 of this embodiment. Except for a configuration of a light-emitting structure layer EMA, the surface emitting laser 10A has a configuration similar to that of the surface emitting laser 10. Except for a configuration of a p-type semiconductor layer 15M1, the light-emitting structure layer EMA has a configuration similar to that of the light-emitting structure layer EM.

In the light-emitting structure layer EMA, the p-type semiconductor layer 15M1 includes a projection 15B1 having an ellipsoidal ring shape (track shape). That is, in this modification, the ring-shaped region R2 having the ellipsoidal ring shape (the low resistance region LR and the high refractive index region) is formed. In the case where the ring-shaped region R2 is thus formed as well, for example, by adjusting the width of the projection 15B1, the eigenmode of the laser beam LB is stabilized. Therefore, for example, the far-field pattern of the unimodal laser beam LB can be obtained. The laser beam LB having a low emission angle and a high intensity can be obtained.

Figure 7B:
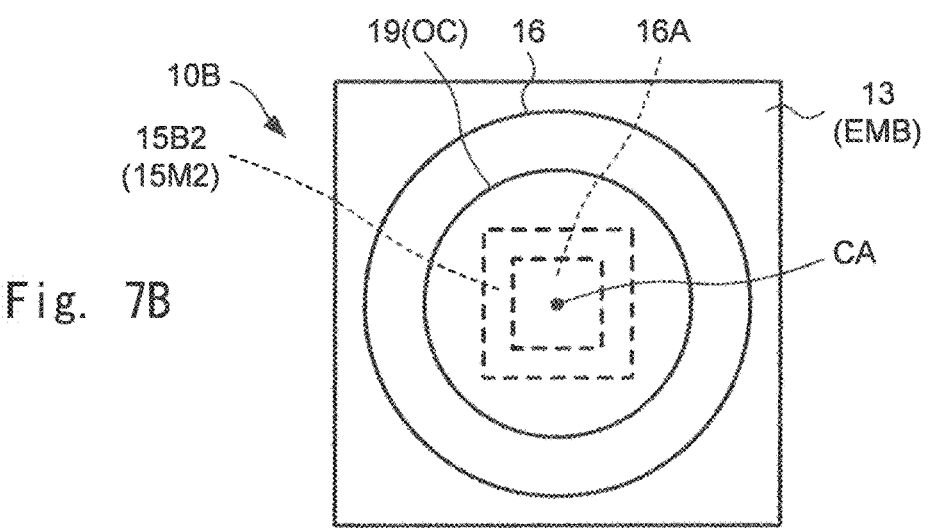
FIG. 7B is a schematic top view of a surface emitting laser according to Modification 2 of Embodiment 1.

FIG. 7B is a schematic top view of a surface emitting laser 10B according to Modification 2 of this embodiment. Except for a configuration of a light-emitting structure layer EMB, the surface emitting laser 10B has a configuration similar to that of the surface emitting laser 10. Except for a configuration of a p-type semiconductor layer 15M2, the light-emitting structure layer EMB has a configuration similar to that of the light-emitting structure layer EM.

In the light-emitting structure layer EMB, the p-type semiconductor layer 15M2 includes a projection 15B2 having a rectangular ring shape. That is, in this modification, the ring-shaped region R2 (the low resistance region LR and the high refractive index region) having the rectangular ring shape is formed. In the case where the ring-shaped region R2 is thus formed as well, for example, by adjusting the width of the projection 15B2, the eigenmode of the laser beam LB is stabilized. Therefore, for example, the far-field pattern of the unimodal laser beam LB having the low emission angle and high intensity can be obtained.

Figure 7C:
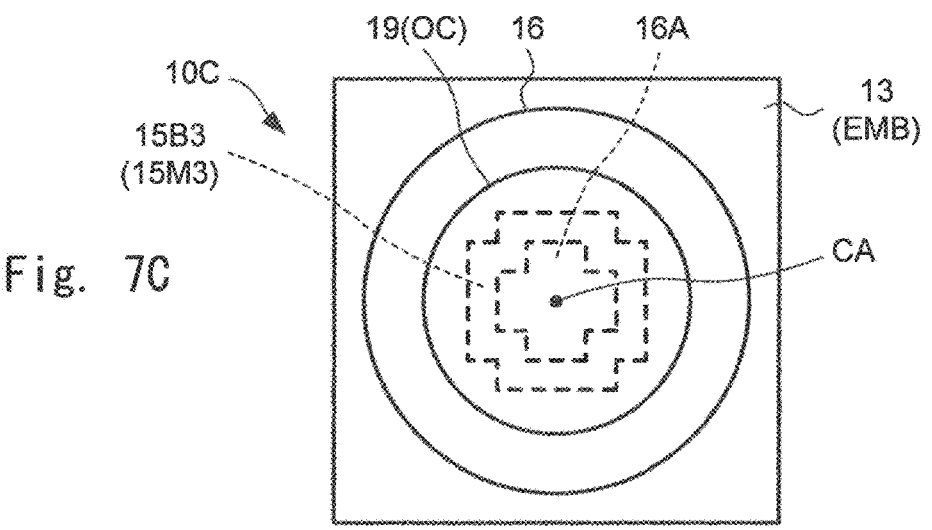
FIG. 7C is a schematic top view of a surface emitting laser according to Modification 3 of Embodiment 1.

FIG. 7C is a schematic top view of a surface emitting laser 10C according to Modification 3 of this embodiment. Except for a configuration of a light-emitting structure layer EMC, the surface emitting laser 10C has a configuration similar to that of the surface emitting laser 10. Except for a configuration of a p-type semiconductor layer 15M3, the light-emitting structure layer EMC has a configuration similar to that of the light-emitting structure layer EM.

In the light-emitting structure layer EMC, the p-type semiconductor layer 15M3 includes a ring-shaped projection 15B3 so as to surround a cross. That is, in this modification, the ring-shaped region R2 (the low resistance regions LR and the high refractive index region) surrounding the cross is formed. In the case where the ring-shaped region R2 is thus formed as well, for example, by adjusting the width of the projection 15B3, the eigenmode of the laser beam LB is stabilized. Therefore, for example, the far-field pattern of the unimodal laser beam LB having the low emission angle and high intensity can be obtained.

Thus, in this embodiment, disposing the ring-shaped low resistance region LR in the resonator OC stabilizes the eigenmode of the light that appears in the ring-shaped region R2. Accordingly, for example, the laser beam LB in the single eigenmode (for example, see FIG. 6C) is obtained, and the laser beam LB as a collection of lights in a plurality of eigenmodes (for example, see FIG. 6B) is obtained. Accordingly, for example, as illustrated in FIG. 7A to FIG. 7C, the low resistance region LR can have various kinds of configurations.

In this embodiment, the case where the low resistance region LR is formed in the light-emitting structure layer EM with the p-type semiconductor layer 15 and the insulating layer 16 has been described. However, the configuration of the low resistance region LR is not limited to this. For example, the regions other than the ring-shaped region may be set in the high resistance on the upper surface of the p-type semiconductor layer 15 to form the low resistance region LR.

As described above, in this embodiment, the surface emitting laser 10 includes the substrate 11, the first reflecting mirror 12 formed on the substrate 11, the light-emitting structure layer EM formed on the first reflecting mirror 12 and including the light-emitting layer 14, and the second reflecting mirror 19 formed on the light-emitting structure layer EM. The resonator OC is constituted between the second reflecting mirror 19 and the first reflecting mirror 12. Additionally, the light-emitting structure layer EM includes: the low resistance region LR formed in the ring shape between the first and the second reflecting mirrors 12 and 19, and the high resistance region HR that is disposed inside the low resistance region LR and has the electrical resistance higher than that of the low resistance region LR. This allows providing the surface emitting laser 10 configured to emit the light in the stable transverse mode.

Embodiment 2

Figure 8:
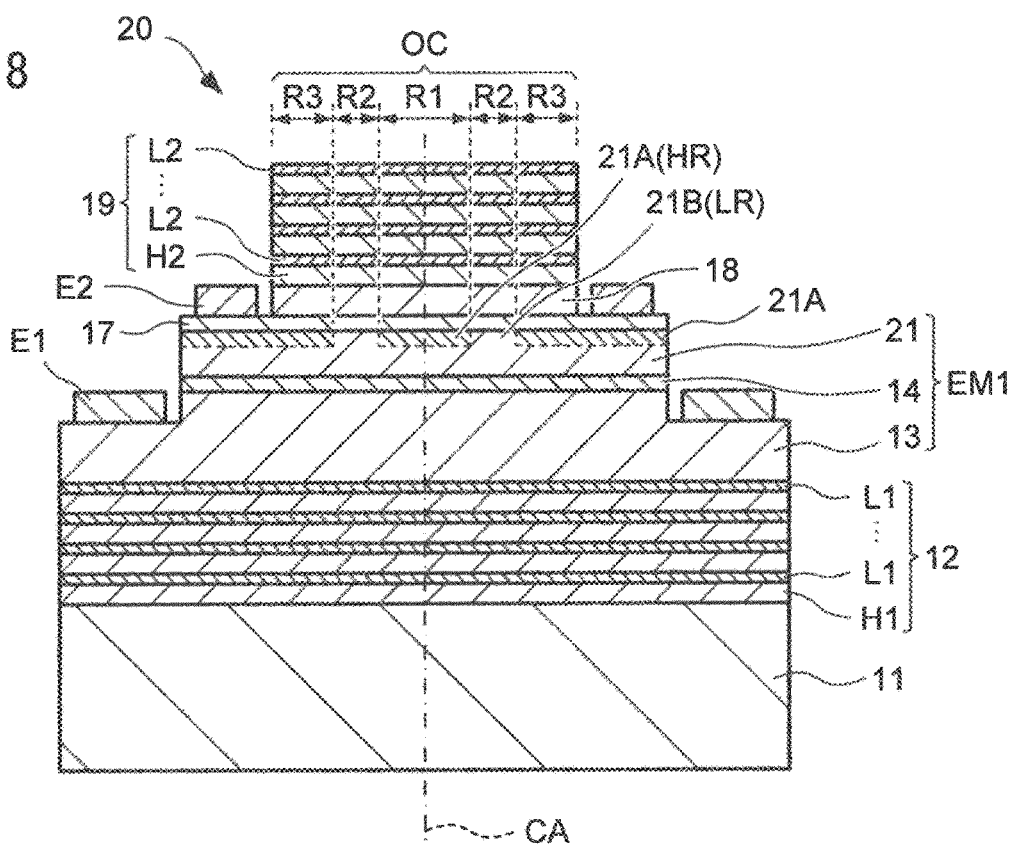
FIG. 8 is a cross-sectional view of a surface emitting laser according to Embodiment 2.

FIG. 8 is a cross-sectional view of a surface emitting laser 20 according to Embodiment 2. Except for configurations of a light-emitting structure layer EM1 and the low resistance region LR, the surface emitting laser 20 has a configuration similar to that of the surface emitting laser 10.

The light-emitting structure layer EM1 includes a p-type semiconductor layer (second semiconductor layer) 21 including an ion implanted region 21A into which ions have been implanted with the ring-shaped region left. For example, the ion implanted region 21A is a region of the upper surface of the p-type semiconductor layer 21 into which B ions, Al ions, or oxygen ions have been implanted.

In the ion implanted region 21A, p-type impurities are inactivated. That is, the ion implanted region 21A functions as the high resistance region HR. In the ion implanted region 21A, implantation of ions changes the refractive index.

In this embodiment, a region 21B of the p-type semiconductor layer 21 other than the ion implanted region 21A is a non-ion implanted region formed in a ring shape where ion implantation is not performed. Therefore, in this embodiment, the non-ion implanted region 21B functions as the low resistance region LR and forms the ring-shaped region R2.

As in this embodiment, differences can be provided in electrical resistance and refractive index by whether to perform ion implantation. Therefore, the low resistance region LR can be disposed in the light-emitting structure layer EM. This allows providing the surface emitting laser 20 configured to emit the light in the stable transverse mode.

Embodiment 3

Figure 9:
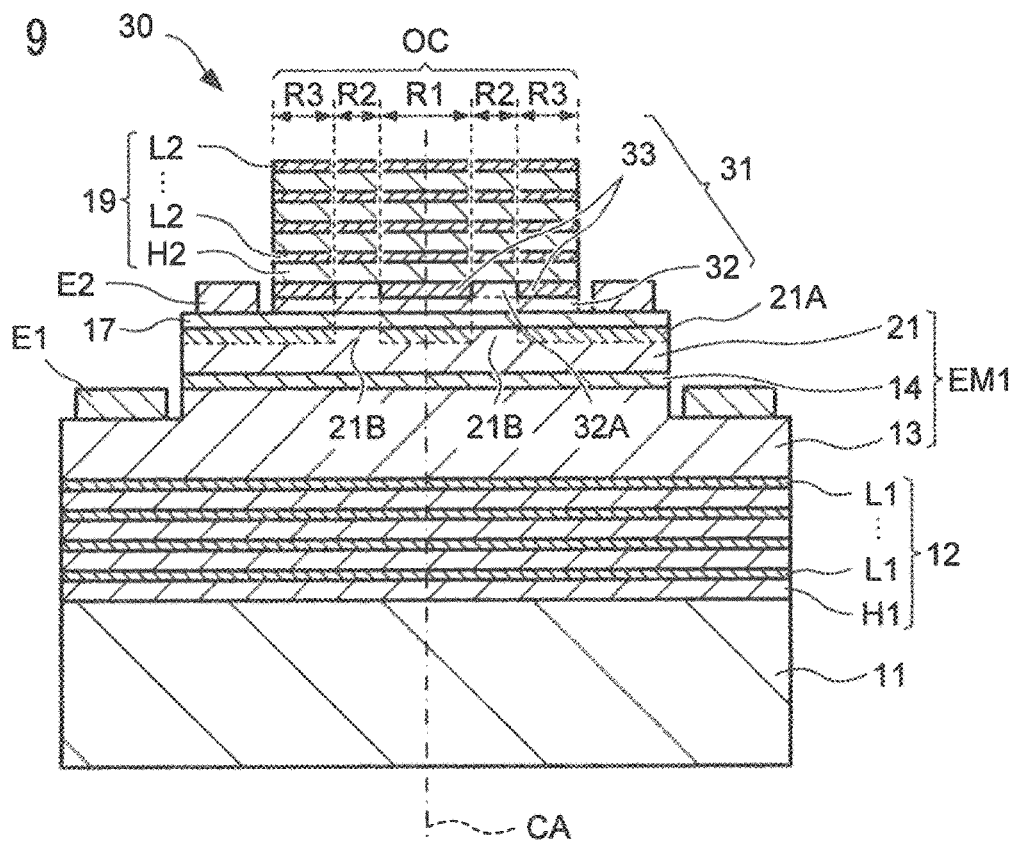
FIG. 9 is a cross-sectional view of a surface emitting laser according to Embodiment 3.

FIG. 9 is a cross-sectional view of a surface emitting laser 30 according to Embodiment 3. Except that the surface emitting laser 30 includes an insulating layer (second insulating layer) 31 formed between the light-emitting structure layer EM1 and the second reflecting mirror 19 and having different refractive indexes between regions, the surface emitting laser 30 has a configuration similar to that of the surface emitting laser 20.

In the surface emitting laser 30, the insulating layer 31 includes a high refractive index insulating layer 32 formed on the light-transmitting electrode layer 17 and including a projection 32A on a non-ion implanted region 21B, and a low refractive index insulating layer 33 formed on the high refractive index insulating layer 32 while exposing the projection 32A and having a refractive index lower than that of the high refractive index insulating layer 32. For example, the high refractive index insulating layer 32 is made of $Nb_2O_5$. For example, the low refractive index insulating layer 33 is made of $SiO_2$.

In this embodiment, in addition to the inside of the light-emitting structure layer EM1, the insulating layer 31, which is formed outside the light-emitting structure layer EM1, provides the difference in refractive index between the central region R1, the ring-shaped region R2, and the outer region R3. Accordingly, for example, the low resistance region LR and the high resistance region HR can be preferentially and reliably defined by the light-emitting structure layer EM1, and the low refractive index region and the high refractive index region can be defined and reinforced by the insulating layer 31. This allows providing the surface emitting laser 30 configured to emit the light in the stable transverse mode.

Embodiment 4

Figure 10:
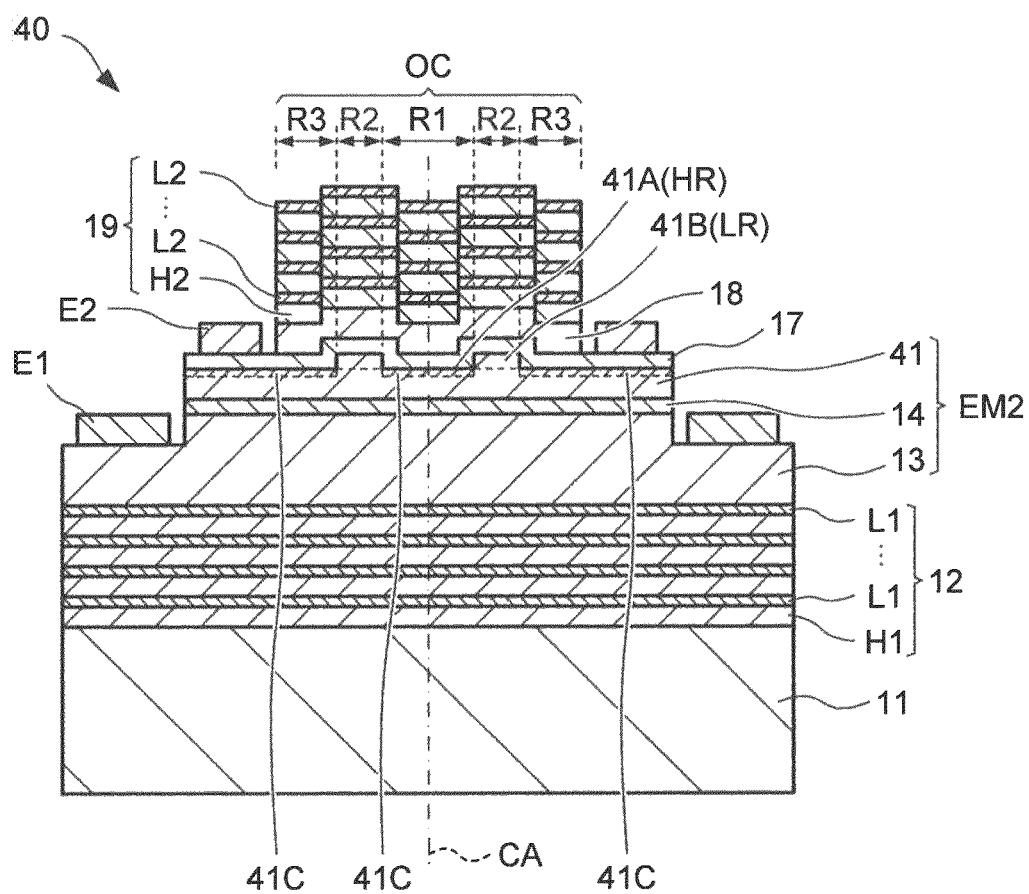
FIG. 10 is a cross-sectional view of a surface emitting laser according to Embodiment 4.

FIG. 10 is a cross-sectional view of a surface emitting laser 40 according to Embodiment 4. Except for configurations of a light-emitting structure layer EM2 and the low resistance region LR, the surface emitting laser 40 has a configuration similar to that of the surface emitting laser 10.

In the surface emitting laser 40, the light-emitting structure layer EM2 includes a p-type semiconductor layer 41 including etched portion 41A on which dry etching was performed with a ring-shaped region left. The ring-shaped upper surface region on which etching is not performed in the p-type semiconductor layer 41 becomes a projection 41B.

A surface of the semiconductor, such as the p-type semiconductor layer 41, containing impurities is roughened by dry etching. This inactivates the p-type impurities in the etched portion 41A. That is, the p-type semiconductor layer 41 includes inactivated region 41C where the p-type impurities are inactivated in the regions of the etched portion 41A. Therefore, the inactivated region 41C functions as the high resistance regions HR.

In this embodiment, in the etched portion 41A, the p-type semiconductor layer 41 is partially removed. Therefore, the region other than the etched portion 41A becomes the projection 41B projected from the etched portion 41A. In the etched portion 41A, a contact layer, which is generally disposed at an interface with a metal in a semiconductor layer, is removed. Therefore, for example, even when the insulating layer 16 is not disposed as in Embodiment 1, the etched portion 41A is sufficiently set in the high resistance.

Accordingly, first, a current is injected into the light-emitting structure layer EM2 only from the projection 41B. The layer thickness of the p-type semiconductor layer 41 differs between the etched portion 41A and the projection 41B. This allows providing a difference in the equivalent refractive index of the resonator OC, that is, the optical distance in the resonator OC.

Note that, considering disposing the low resistance region LR, the p-type semiconductor layer 41 only needs to selectively include the inactivated regions 41C. Therefore, the p-type semiconductor layer 41 is not limited to the case of including the etched portions 41A on which dry etching was performed. For example, the inactivated regions 41C may be formed by ion implantation, or the inactivated regions 41C may be formed by an asking process.

In this embodiment, the p-type semiconductor layer (second semiconductor layer) 41 in the light-emitting structure layer EM2 includes the inactivated regions 41C where the p-type impurities are inactivated with the ring-shaped region left.

Then, the projection 41B of the p-type semiconductor layer 41 where impurities are not inactivated functions as the low resistance region LR.

Thus, for example, selectively performing etching to partially inactivate the p-type semiconductor layer 41 also allows providing the differences in electrical resistance and refractive index. This allows providing the low resistance region LR in the light-emitting structure layer EM. This allows providing the surface emitting laser 40 configured to emit the light in the stable transverse mode.

Embodiment 5

Figure 11:
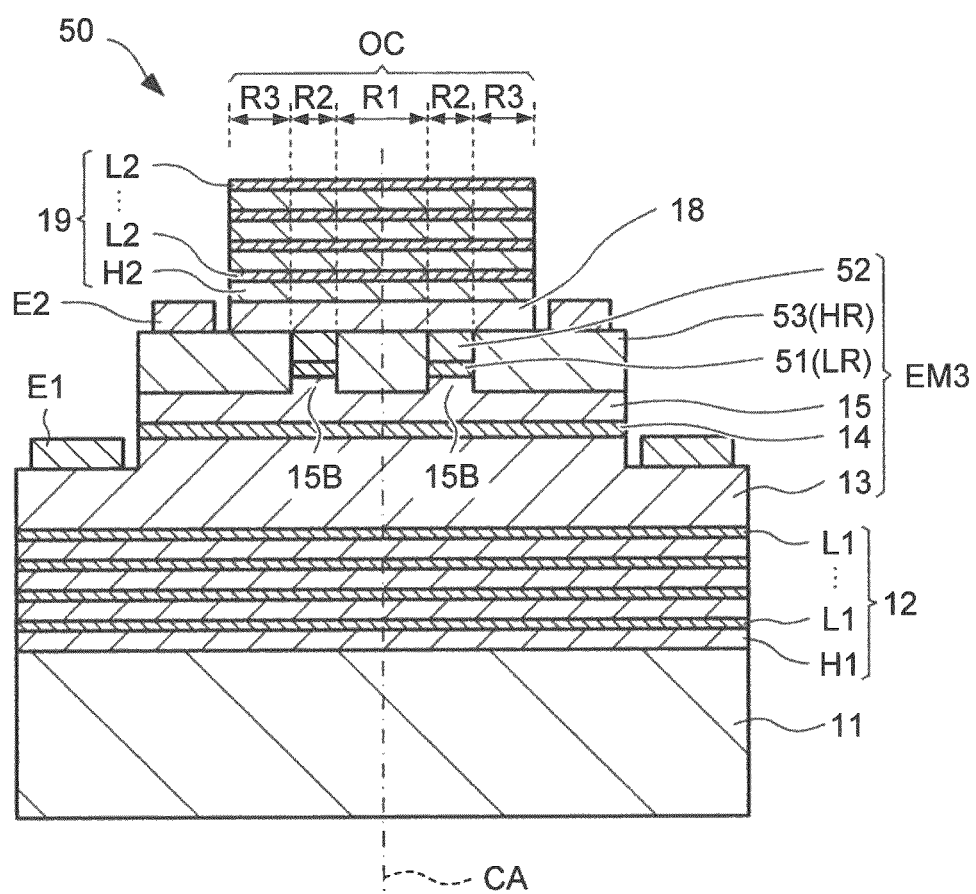
FIG. 11 is a cross-sectional view of a surface emitting laser according to Embodiment 5.

FIG. 11 is a cross-sectional view of a surface emitting laser 50 according to Embodiment 5. Except for configurations of a light-emitting structure layer EM3 and the low resistance region LR, the surface emitting laser 50 has a configuration similar to that of the surface emitting laser 10.

In the surface emitting laser 50, the light-emitting structure layer EM3 includes a tunnel junction layer 51 disposed in a ring shape on the projection 15B of the p-type semiconductor layer 15 and an n-type semiconductor layer (a second n-type semiconductor layer or a third semiconductor layer) 52 disposed on the tunnel junction layer 51. The light-emitting structure layer EM3 includes an n-type semiconductor layer (a third n-type semiconductor layer or a fourth semiconductor layer) 53 that surrounds the side surfaces of the tunnel junction layer 51 and the n-type semiconductor layer 52 and has a refractive index lower than those of the tunnel junction layer 51 and the n-type semiconductor layer 52.

The tunnel junction layer 51 includes a high-doped p-type semiconductor layer (not illustrated) formed on the p-type semiconductor layer 15 and having an impurity concentration higher than that of the p-type semiconductor layer (second semiconductor layer) 15 and a high-doped n-type semiconductor layer (not illustrated) formed on the high-doped p-type semiconductor layer and having an impurity concentration higher than that of the n-type semiconductor layer (the first n-type semiconductor layer or the first semiconductor layer) 13.

In this embodiment, the n-type semiconductor layer 53 contains Ge as n-type impurities. Accordingly, the n-type semiconductor layer 53 has a refractive index lower than the average refractive index of the n-type semiconductor layer 52, the tunnel junction layer 51, and the projection 15B of the p-type semiconductor layer 15.

Therefore, in this embodiment, the tunnel junction layer 51 functions as the low resistance region LR. In this embodiment, namely, the light-emitting structure layer EM3 includes the tunnel junction layer 51 formed in the ring shape on the p-type semiconductor layer 15 (second semiconductor layer) and functioning as the low resistance region LR. The n-type semiconductor layer 53 defines the central region R1 and the outer region R3.

As in this embodiment, current confinement is performed by tunnel junction or the region is disposed in the ring shape to ensure forming the low resistance region LR in the light-emitting structure layer EM3. Decreasing the refractive index at the regions other than the low resistance region LR allows defining the central region R1, the ring-shaped region R2, and the outer region R3. This allows providing the surface emitting laser 50 configured to emit the light in the stable transverse mode.

The above-described embodiments are merely one example. For example, the above-described various kinds of embodiments can be combined. For example, the surface emitting laser 10 may include the insulating layer 31 similar to that of the surface emitting laser 30. For example, the surface emitting laser 40 may include the insulating layer 16 on the inactivated region 41C.

As described above, for example, in the surface emitting laser 10, the light-emitting structure layer EM includes the low resistance region (current injected region CJ) disposed in the ring shape between the first and the second reflecting mirrors 12 and 19. This allows providing the surface emitting laser 10 (vertical cavity surface emitting device) configured to emit the light in the stable transverse mode.

DESCRIPTION OF REFERENCE SIGNS 10, 10A, 10B, 10C, 20, 30, 40, 50 Surface emitting laser (vertical cavity surface emitting device)
EM, EMA, EMB, EMC, EM1, EM2, EM3 Light-emitting structure layer
14 Light-emitting layer
LR Low resistance region

The invention claimed is:
1. A vertical cavity surface emitting device comprising:
a substrate;
a first multilayer film reflecting mirror formed on the substrate;
a light-emitting structure layer that is formed on the first multilayer film reflecting mirror and includes a light-emitting layer; and
a second multilayer film reflecting mirror formed on the light-emitting structure layer, a resonator being constituted between the second multilayer film reflecting mirror and the first multilayer film reflecting mirror,
wherein:
the light-emitting structure layer includes a low resistance region and a high resistance region, the low resistance region is disposed in a ring shape between the first multilayer film reflecting mirror and the second multilayer film reflecting mirror, and the high resistance region is formed inside the low resistance region and has an electrical resistance higher than an electrical resistance of the low resistance region,
the resonator includes a ring-shaped region, a central region, and an outer region, the ring-shaped region corresponds to the low resistance region of the light-emitting structure layer and extends between the first and the second multilayer film reflecting mirrors, the central region is disposed corresponding to the high resistance region inside the ring-shaped region, and the outer region is disposed outside the ring-shaped region, the central region and the outer region have equivalent refractive indexes lower than an equivalent refractive index of the ring-shaped region, and the high resistance region inside the low resistance region has a width twice or more of a diffusion length of carriers in the light-emitting layer.

2. The vertical cavity surface emitting device according to claim 1, wherein when a wavelength of light emitted from the light-emitting layer is defined as a wavelength λ, the equivalent refractive index of the ring-shaped region relative to the wavelength λ is defined as a refractive index nλ, and the equivalent refractive index of the ring-shaped region relative to a wavelength at 445 nm is defined as a refractive index $n_{445}$, a width W1 of the low resistance region meets a relationship $$W1 \geq 2.85 \times (\lambda/0.445) \times (n\lambda/n_{445}) \text{ [µm]}.$$

3. The vertical cavity surface emitting device according to claim 1, wherein:

the light-emitting structure layer includes a first semiconductor layer, the light-emitting layer, and a second semiconductor layer, the first semiconductor layer is formed on the first multilayer film reflecting mirror, the light-emitting layer is formed on the first semiconductor layer, and the second semiconductor layer is formed on the light-emitting layer and has a conductivity type opposite to a conductivity type of the first semiconductor layer, the second semiconductor layer includes an ion implanted region into which ions have been implanted as a region other than the ring-shaped region, and the second semiconductor layer includes a region into which the ions are not implanted as the ring-shaped region corresponding to the low resistance region.

4. The vertical cavity surface emitting device according to claim 1, wherein:

the light-emitting structure layer includes a first semiconductor layer, the light-emitting layer, and a second semiconductor layer, the first semiconductor layer is formed on the first multilayer film reflecting mirror, the light-emitting layer is formed on the first semiconductor layer, and the second semiconductor layer is formed on the light-emitting layer and has a conductivity type opposite to a conductivity type of the first semiconductor layer, the second semiconductor layer includes an inactivated region where impurities have been inactivated as a region other than the ring-shaped region, and the second semiconductor layer includes a region where the impurities are not inactivated as the ring-shaped region corresponding to the low resistance region.

5. The vertical cavity surface emitting device according to claim 1, wherein the light-emitting structure layer includes a first semiconductor layer, the light-emitting layer, a second semiconductor layer, and a tunnel junction layer, the first semiconductor layer is formed on the first multilayer film reflecting mirror, the light-emitting layer is formed on the first semiconductor layer, the second semiconductor layer is formed on the light-emitting layer and has a conductivity type opposite to a conductivity type of the first semiconductor layer, and the tunnel junction layer is formed on the second semiconductor layer in the ring-shaped region corresponding to the low resistance region.

6. The vertical cavity surface emitting device according to claim 1, wherein the ring-shaped region has one of a circular ring shape, a rectangular ring shape, and a ring shape surrounding a cross when viewed from a direction perpendicular to an upper surface of the light-emitting structure layer.

7. The vertical cavity surface emitting device according to claim 1, wherein the light-emitting structure layer includes a plurality of semiconductor layers made of nitride semiconductor.

8. A vertical cavity surface emitting device comprising:

a substrate;

a first multilayer film reflecting mirror formed on the substrate;

a light-emitting structure layer that is formed on the first multilayer film reflecting mirror and includes a light-emitting layer; and a second multilayer film reflecting mirror formed on the light-emitting structure layer, a resonator being constituted between the second multilayer film reflecting mirror and the first multilayer film reflecting mirror, wherein:

the light-emitting structure layer includes a low resistance region and a high resistance region, the low resistance region is disposed in a ring shape between the first multilayer film reflecting mirror and the second multilayer film reflecting mirror, and the high resistance region is formed inside the low resistance region and has an electrical resistance higher than an electrical resistance of the low resistance region, the resonator includes a ring-shaped region, a central region, and an outer region, the ring-shaped region corresponds to the low resistance region of the light-emitting structure layer and extends between the first and the second multilayer film reflecting mirrors, the central region is disposed corresponding to the high resistance region inside the ring-shaped region, and the outer region is disposed outside the ring-shaped region, the central region and the outer region have equivalent refractive indexes lower than an equivalent refractive index of the ring-shaped region, the light-emitting structure layer includes a first semiconductor layer, the light-emitting layer, and a second semiconductor layer, the first semiconductor layer is formed on the first multilayer film reflecting mirror, the light-emitting layer is formed on the first semiconductor layer, and the second semiconductor layer is formed on the light-emitting layer and has a conductivity type opposite to a conductivity type of the first semiconductor layer, the second semiconductor layer includes an upper surface and a projection, the projection projecting from the upper surface in the ring-shaped region, the upper surface of the second semiconductor layer functions as the high resistance region by being covered with an insulating layer, the projection of the second semiconductor layer contacts an electrode to function as the low resistance region, and the second semiconductor layer has a layer thickness twice or less of a diffusion length of carriers in the light-emitting layer.

* * * * *